United States Patent
Fastow et al.

(10) Patent No.: US 7,320,944 B1
(45) Date of Patent: Jan. 22, 2008

(54) DEPOSITION OF PHOSPHOSILICATE GLASS FILM

(75) Inventors: Michal Efrati Fastow, Cupertino, CA (US); Ryan Holler, Eagan, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 162 days.

(21) Appl. No.: 11/169,172

(22) Filed: Jun. 27, 2005

Related U.S. Application Data

(60) Provisional application No. 60/582,991, filed on Jun. 25, 2004.

(51) Int. Cl.
*H01L 21/469* (2006.01)
*H01L 21/31* (2006.01)

(52) U.S. Cl. .................. 438/787; 438/783; 438/786; 257/E21.275

(58) Field of Classification Search ............. 438/783, 438/786, 787
See application file for complete search history.

(56) References Cited

U.S. PATENT DOCUMENTS 6,352,591 B1 * 3/2002 Yieh et al. .................. 118/697
7,001,854 B1 * 2/2006 Papasouliotis et al. ...... 438/788
2001/0054387 A1 * 12/2001 Frankel et al. .............. 118/725

OTHER PUBLICATIONS

Encyclopedia of Chemical Technology, Kirk-Othmer, vol. 14, pp. 677-709, (1995).

* cited by examiner

*Primary Examiner*—Alexander Ghyka
(74) *Attorney, Agent, or Firm*—Evan Law Group LLC

(57) ABSTRACT

A method of forming a phosphosilicate glass, includes flowing a pre-deposition gas comprising an inert gas into a deposition chamber containing a substrate, where the temperature of the substrate is at a pre-deposition temperature of at least 400° C; continuously increasing the temperature of gas in the chamber to a deposition temperature and simultaneously continuously increasing a flow rate of phosphine and silane until a phosphine:silane deposition ratio is achieved; and depositing the phosphosilicate glass on the substrate at the deposition temperature and at the phosphine:silane deposition ratio.

19 Claims, 5 Drawing Sheets

DEPOSITION OF PHOSPHOSILICATE GLASS FILM

CROSS-REFERENCE TO RELATED APPLICATION

This application claims priority to provisional application Ser. No. 60/582,991, entitled "METHOD TO DEPOSIT A HIGH DENSITY PLASMA CHEMICAL VAPOR DEPOSTION PHOSPHOSILICATE GLASS FILM" filed 25 Jun. 2004, the entire contents of which are hereby incorporated by reference, except where inconsistent with the present application.

BACKGROUND

In processing wafers or substrates to make integrated circuits (ICs) or semiconductor devices, it is often desirable to provide a doped silicon oxide layer or film, such as a phosphosilicate glass (PSG) film. Typically, PSG films are deposited at elevated temperatures by chemical vapor deposition (CVD) through a reaction of source gases such as silane ($SiH_4$) and phosphine ($PH_3$) at or near the surface of the substrate. The process is carried out with plasma enhanced CVD (PECVD) in which low frequency RF (LFRF) power is coupled to the gas in the deposition chamber to form the plasma, and high frequency RF (HFRF) is applied to control the ion energies. The $SiH_4$ and $PH_3$ are introduced in a series of discrete steps, as shown in FIG. 1, to control the concentration of phosphorous at the beginning of deposition. FIG. 1 is a graph of the voltage applied to the mass flow controller (MFC) or metering valves over time, illustrating at least four discrete steps for increasing $SiH_4$ and $PH_3$ flow in a conventional process for depositing a PSG film.

In conventional processes the temperature of the substrate is raised to a final deposition temperature in a number of steps. These steps include heating the substrate to a relatively low pre-deposition temperature (340° C.) and steps in which the discrete increases in $SiH_4$ and $PH_3$ results in discrete increases in temperature. The final temperature is significantly higher than the pre-deposition temperature. A problem with this conventional process is that the interruption in process gas flows, i.e., $SiH_4$ and $PH_3$ gas flows, causes discontinuities in the film and creates interfaces rich in phosphorous or which have a relatively high percentage of phosphorous. As shown in FIG. 2, cave defects are formed along these phosphorous rich interfaces in subsequent processing. These defects were typically not a problem in previous generations of ICs, which have elements and features much larger than the size of the cave defects. However, with the shrinking geometries of the latest generation of ICs, these and other defects caused by phosphorous rich interfaces have resulted in substantially lower yields, or yield loss, in the number of working ICs or devices produced. In particular, interaction between the phosphorous rich locations and polymer formed during a self-aligned contact (SAC) etch, such as polymer formed from an etch plasma formed from $CF_4$, and cleaning solutions, such as SC1, cause cave defects and failure of the SAC contact.

Non-uniform distribution of phosphorous through the thickness of the PSG film may result in other defects and further yield loss. FIG. 3 is a bar graph of the percent loss of lots of substrates or wafers due to one such defect, referred to as elephant's foot, which is caused by non-uniformity in the phosphorous content through a PSG film. As illustrating in FIG. 3, as much as 20 percent of wafers in a lot may be lost as a result of this defect. FIG. 4 is a graph illustrating the non-uniformity of the phosphorous content in a PSG film deposited by a conventional process.

Another problem with conventional processes for depositing a PSG film is oxidation or excess oxidation of exposed metal, such as the metal of a gate contact, due to exposure to oxygen containing gases during the CVD process. Typically, this occurs during the pre-deposition stage when the substrate is heated to the pre-deposition temperature in an oxygen containing atmosphere. For example, many conventional processes flow a mixture of helium (He) and oxygen ($O_2$) in a 1:1 or 1.7:1 ratio while heating the substrate to the pre-deposition temperature.

SUMMARY

In a first aspect, the present invention is a method of forming a phosphosilicate glass, comprising flowing a pre-deposition gas comprising an inert gas into a deposition chamber containing a substrate, wherein the temperature of the substrate is at a pre-deposition temperature of at least 400° C.; continuously increasing the temperature of the substrate to a deposition temperature and simultaneously continuously increasing a flow rate of phosphine and silane until a phosphine:silane deposition ratio is achieved; and depositing the phosphosilicate glass on the substrate at the deposition temperature and at the phosphine:silane deposition ratio.

In a second aspect, the present invention is a method of forming a phosphosilicate glass, comprising flowing a pre-deposition gas comprising helium and oxygen into a deposition chamber containing a substrate, wherein the temperature of the substrate is at a pre-deposition temperature of 440-460° C.; continuously increasing the temperature of the substrate to a deposition temperature and simultaneously continuously increasing a flow rate of phosphine and silane until a phosphine:silane deposition ratio is achieved; and depositing the phosphosilicate glass on the substrate at the deposition temperature and at the phosphine:silane deposition ratio. A ratio of flow rates of helium:oxygen is 8-11:1.

In a third aspect, the present invention is a phosphosilicate glass on a substrate. The phosphosilicate glass at a depth of 10% to 90% of a thickness of the phosphosilicate glass has a phosphorous content of 8.5 to 10.5% and which varies by at most 1%.

DETAILED DESCRIPTION

The present invention makes use of the discovery that replacing step-wise increases in temperature and step-wise changes in silane and phosphine gas flows with continuous changes in temperature and continuous changes is gas flows, during deposition of a PSG film, will result in a more homogeneous phosphorous content, reducing defects, such as cave defects and elephant's foot. Furthermore, by increasing the ratio of helium to oxygen during heating of a substrate prior to PSG film deposition, undesirable oxidation of metal on the substrate may be reduced.

Figure 1:
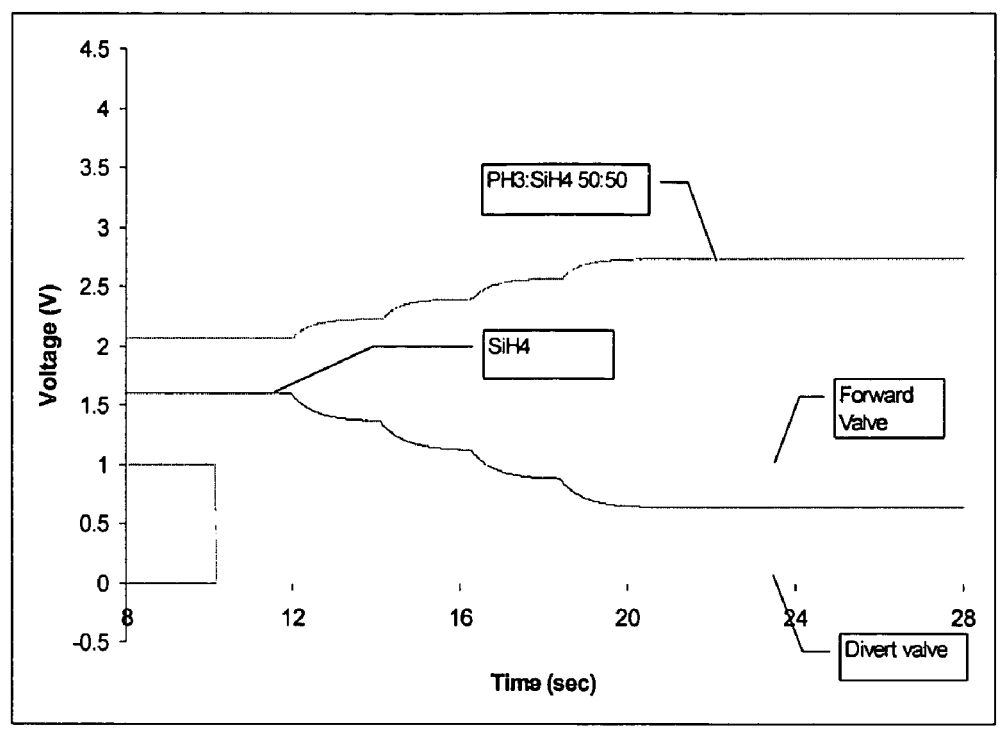
FIG. 1 is a graph of voltage applied to a mass flow controller over time illustrating a stepped increase of silane and phosphine in a conventional process for depositing a PSG film.
Figure 2:
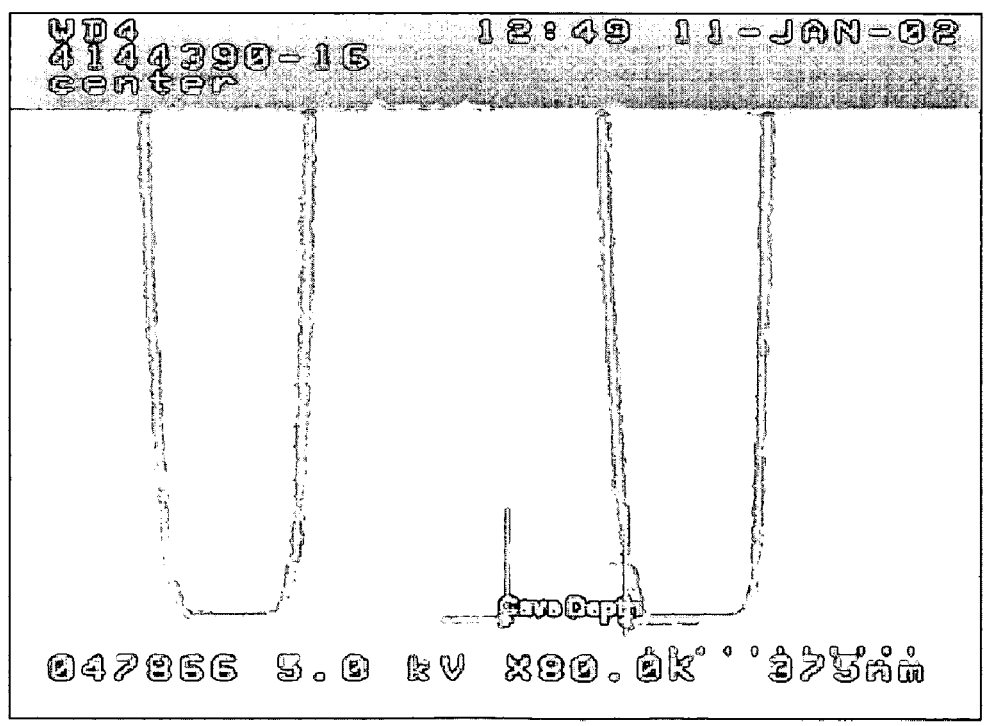
FIG. 2 is an electron microscope image of a sectional side view of a PSG film deposited by a conventional process showing cave defects.
Figure 3:
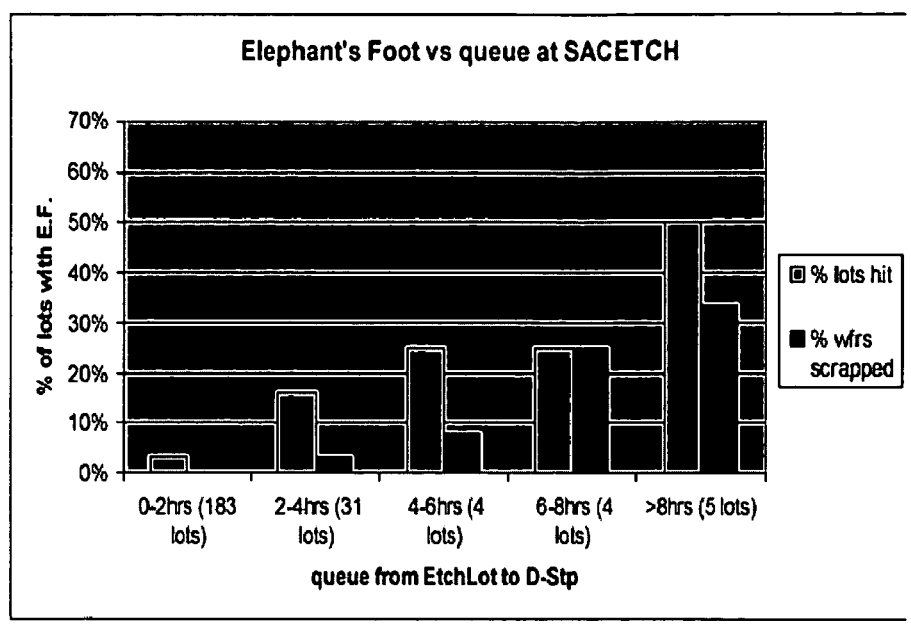
FIG. 3 is a graph of a percent of lots of wafers having elephant's foot, a defect caused by non-uniformity in the phosphorous content through a PSG film deposited by a conventional process, and illustrating a percent of wafers scrapped as a result of the defect.
Figure 4:
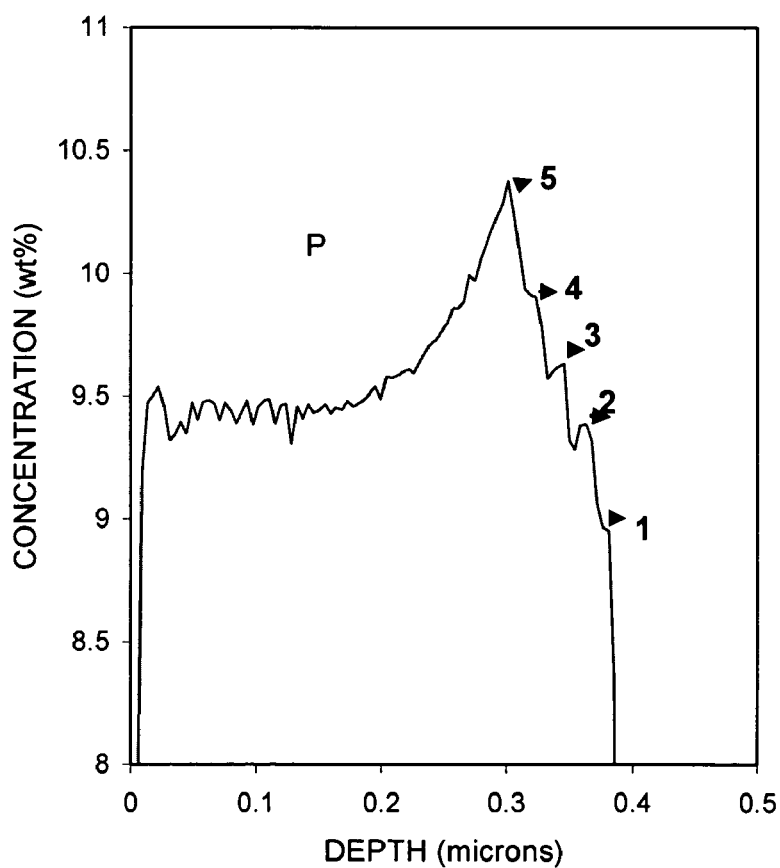
FIG. 4 is a graph illustrating non-uniformity in the phosphorous content through a PSG film deposited by a conventional process.
Figure 5:
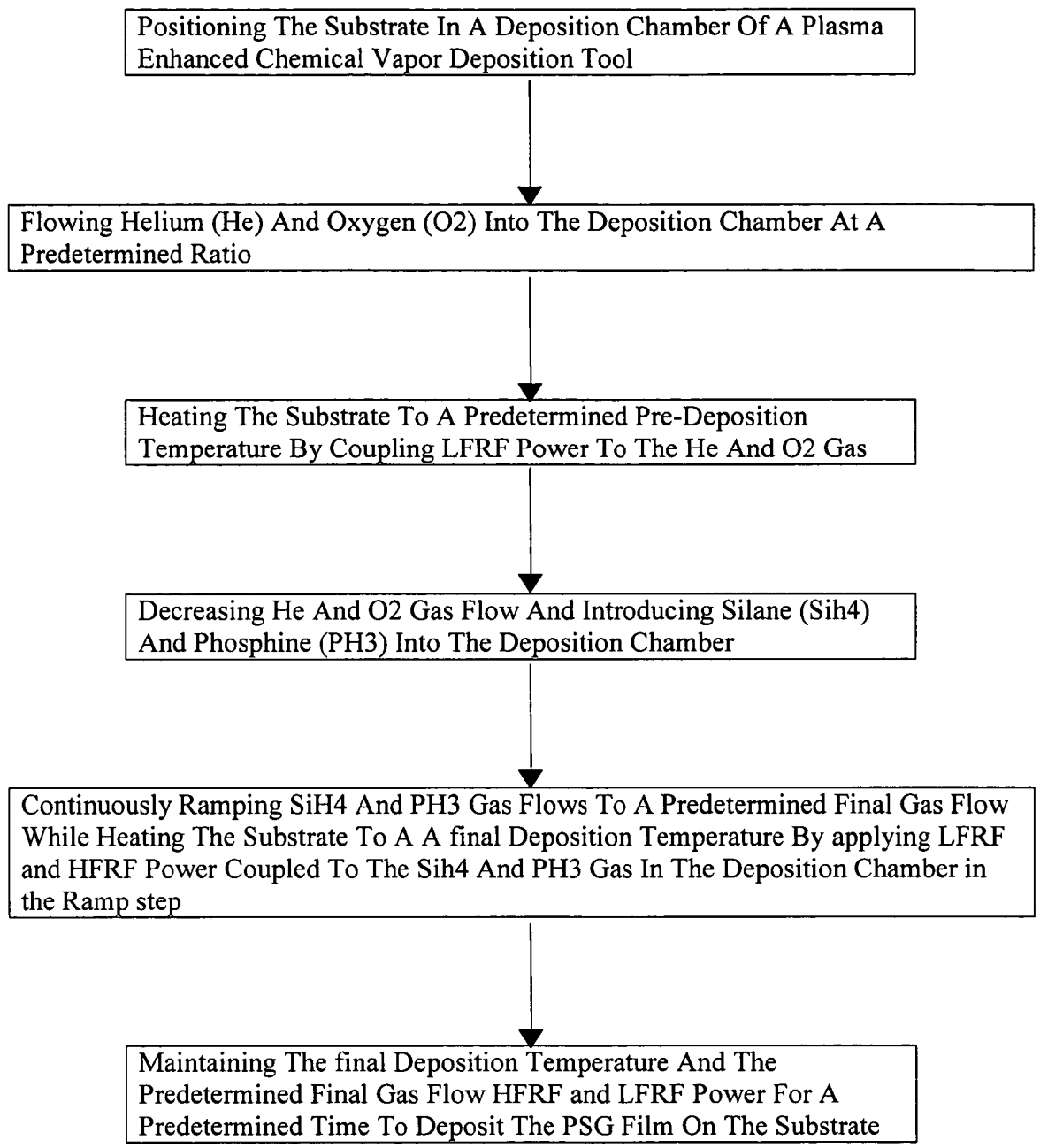
FIG. 5 is a flowchart of a process for depositing a PSG film on a substrate according to an embodiment of the present invention.

A flowchart of a process for depositing a PSG film on a substrate according to an embodiment of the present invention is shown in FIG. 5. Referring to FIG. 5, the process includes preliminary aspects: (i) positioning the substrate in a deposition chamber of a plasma enhanced Chemical Vapor Deposition (CVD) tool; (ii) flowing helium and oxygen into the deposition chamber; and (iii) heating the substrate to a pre-deposition temperature. Next, the method includes (iv) introducing silane and phosphine; (v) continuously ramping $SiH_4$ and $PH_3$ gas flows to a final gas flow rate while heating the substrate to the final deposition temperature by continuous heating; and (vi) maintaining the final gas flow and the final deposition temperature until deposition of the PSG film is completed.

The gas mixture is preferably energized to form a plasma by coupling radio frequency (RF) power to gas between a top and bottom electrode in a sealed deposition chamber or reactor of a plasma CVD system or tool. Preferably, the plasma CVD tool is a high density plasma (HDP) tool, so that deposition of the film is by high density plasma CVD (HDPCVD). By HDP it is meant a plasma with a high concentration of free electrons, and hence a high concentration of ions. Suitable plasma CVD tools include, for example, a C2 tool commercially available from Novellus of San Jose, California.

Figure 6:
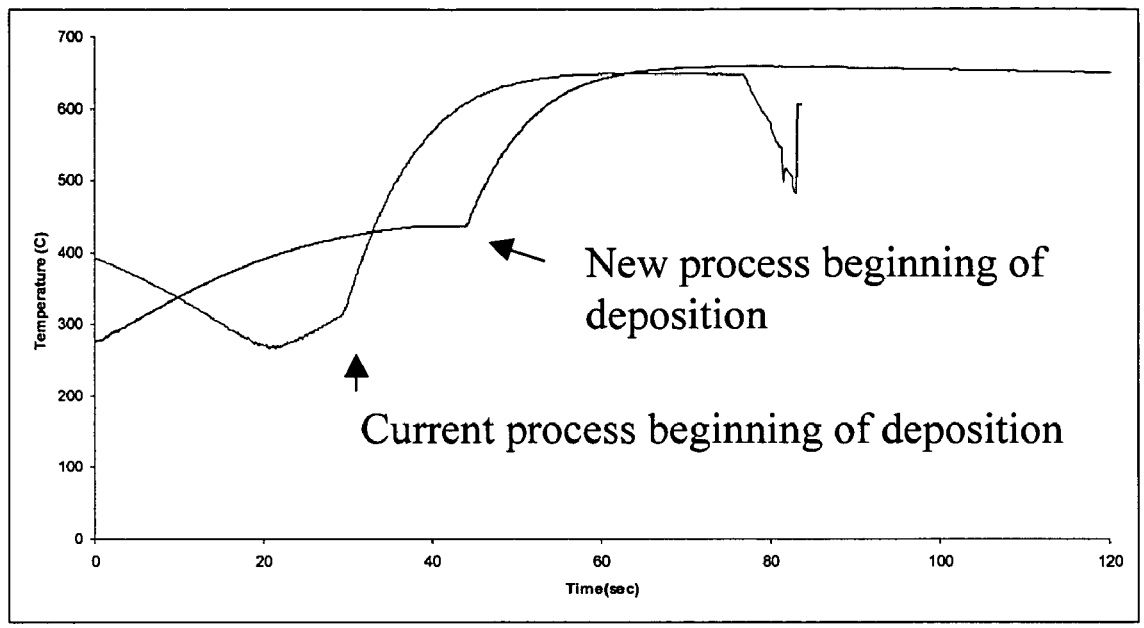
FIG. 6 is a graph of pre-deposition and deposition temperatures of a process for depositing a PSG film on a substrate according to an embodiment of the present invention, as compared to a conventional process for depositing a PSG film.

During pre-deposition heating a single frequency power is applied (LFRF), and during deposition a dual frequency HFRF and LFRF power is applied. As a result, the rate at which the substrate is heated to the final deposition temperature is greater than the rate at which the substrate is heated to the pre-deposition temperature. Preferably, the temperature of the substrate during deposition is increased at a rate of 13 to 50° C./s, including 20 to 30° C./s. More preferably, the temperature increase of the substrate during deposition is 25° C./s and the temperature increase of the substrate during pre-deposition heating up is at least 12.5° C./s. FIG. 6 is a graph of pre-deposition and deposition temperatures of a process for depositing a PSG film on a substrate according to an embodiment of the present invention, as compared to a conventional process.

In one embodiment, flowing He and $O_2$ at a predetermined ratio includes flowing He and $O_2$ at a ratio selected to provide a substantially He gas ambient and to prevent substantial oxidation of a metal gate on the substrate. Although oxygen is not required, more preferably, the He to $O_2$ ratio is further selected to provide sufficient $O_2$ to substantially prevent diffusion of phosphorous into implanted areas of the substrate. Preferably, more helium than oxygen is provided to the chamber, such as a helium to oxygen ratio of at least 1.8:1, including 2-100:1, 3-30:1 and 8-11:1. In one exemplary embodiment, the He to $O_2$ ratio is about 9.5:1. Other inert gases, such as Ar and Ne, may be used instead of He, or in addition to He, but are less preferred.

Heating the substrate to a pre-deposition temperature preferably includes heating the substrate to a temperature of at least 400° C., more preferably at least 440° C., such as 440-460° C. The heating can be accomplished, for example, by coupling an RF power of at least about 4800 W to the He and $O_2$ gas for a period of at least about 30 seconds.

Comparison of parameters of an exemplary recipe of a process for depositing a PSG film deposited according to an embodiment of the present invention and a conventional process are provided in the Table I.

TABLE I

| Parameter | Current Process | New process |
|---|---|---|
| Recipe Input | | |
| HEAT STEP | | |
| LF Heat (Watt) | 4000 | 4800 |
| Ar Heat (sccm) | 0 | 0 |
| He Heat (sccm) | 200 | 950 |
| O2 Heat (sccm) | 120 | 100 |
| Current RAMP Step | | |
| 1STD (sec) | | |
| RmpT (sec) | 2 | |
| RmS1, RmP1 (sccm) | 66, 124 | |
| RmS2, RmP2 (sccm) | 56, 134 | |
| RmS3, RmP3 (sccm) | 46, 144 | |
| RmS4, RmP4 (sccm) | 36, 154 | |
| New RAMP Step | | |
| 1SiH (sccm) | 66 | 66 |
| 1AX6 (sccm) | 124 | 124 |
| RSiH (sccm) | | 26 |
| RPH3 (sccm) | | 164 |
| RTIM (sccm) | 8 | 8 |
| Main Deposition | | |
| 300-450 KHZ LFRF (Watt) | 3600 +/− 100 | 3600 +/− 100 |
| 13.56 MHZ, HFRF (Watt) | 2000 | 2000 |
| 1SiH (sccm) | 26 | 26 |
| 1AX6 (sccm) | 164 +/− 4 | 164 +/− 4 |
| 1O2 (sccm) | 575 | 575 |
| 1He (sccm) | 100 | 100 |

Figure 7:
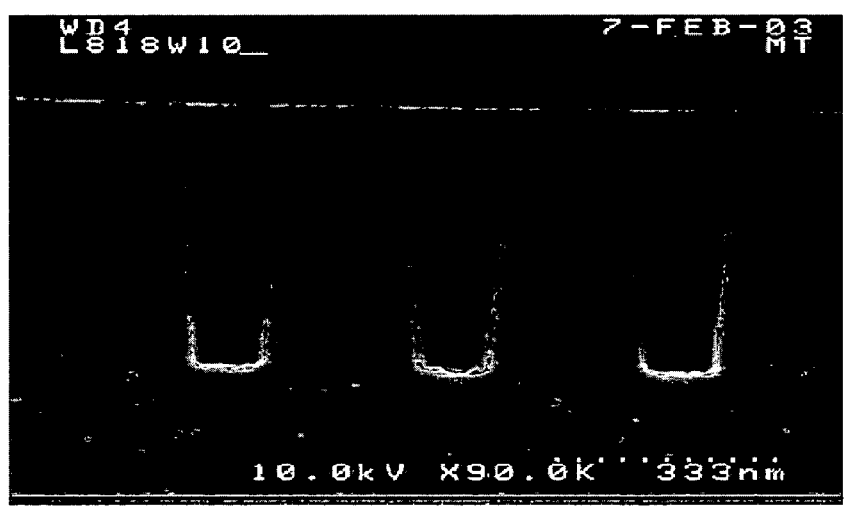
FIG. 7 is an electron microscope image of a sectional side view of a PSG film deposited according to an embodiment of the present invention, showing that the film is substantially free of cave defects.
Figure 8:
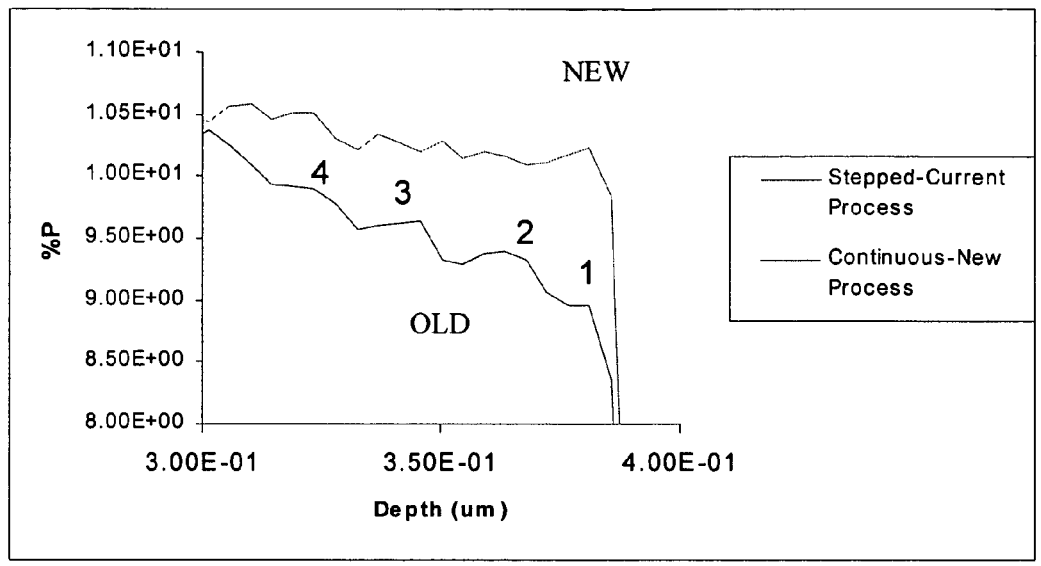
FIG. 8 is a graph comparing uniformity of the phosphorous content through a PSG film deposited according to an embodiment of the present invention to a PSG film deposited by a conventional process.
Figure 9:
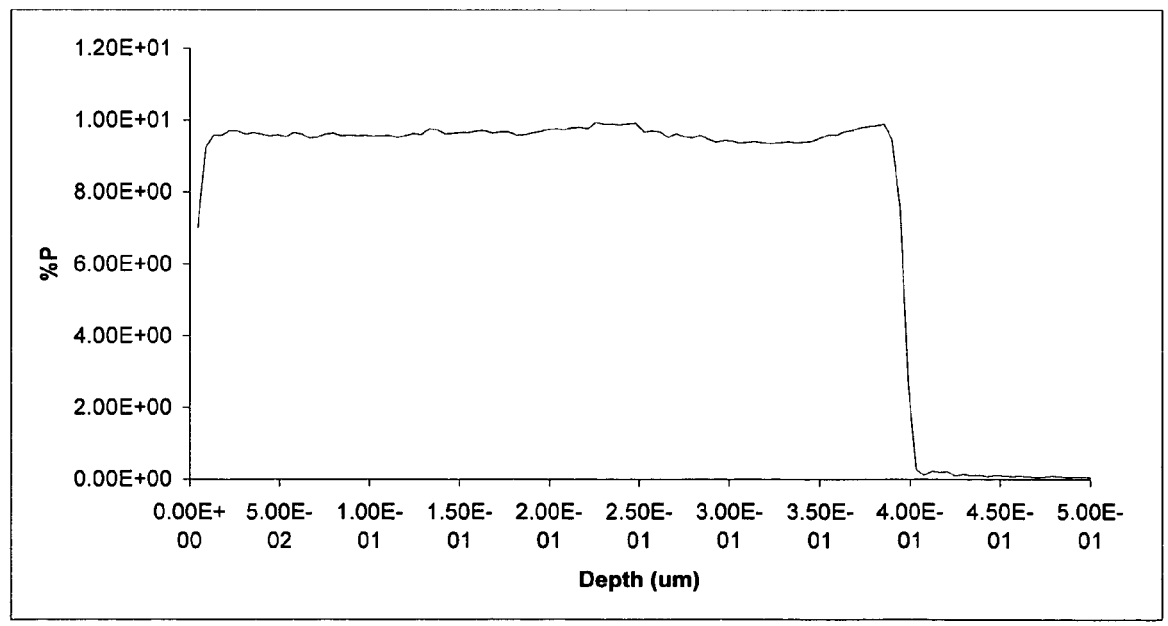
FIG. 9 is another graph showing uniformity of the phosphorous through a PSG film deposited according to an embodiment of the present invention.

A brief synopsis of a process for depositing a PSG film according to an embodiment of the present invention and using the recipe of Table I is as follows:

Step 1: Check pre-conditions
Step 2: Pedestal Up: LFHt
Step 3: He Select:1-He,2-He
Step 4: Heat wafer:wait(Heat)
Step 5: Gas Flows 1 or 2 and Divert
Step 6: Check ESC 1: ChkV,CDly Step 7: Enable Helium 1:1-He, 1-LF
Step 8: Dep. 1: Ramp PH3 and SiH4
Step 9: Gas Flow 2 and Divert:wait(2gDy)
Step 10: Check ESC 2:ChkV,CDly
Step 11: Set Helium 2:2-He
Step 12: Dep. 2:2-LF/HF,SdW2,wait(2SDT)
Step 13: End Process:HF-RF off,Idle Plasma For comparison, a brief synopsis of a conventional process for depositing a PSG film using the recipe of Table I is as follows:

Step 1: Check pre-conditions
Step 2: Pedestal Up: LFHt
Step 3: He Select:1-He,2-He
Step 4: Heat wafer—wait (Heat)
Step 5: Gas Flows 1 or 2 and Divert
Step 6: Check ESC 1:ChkV,CDly
Step 7: Enable Helium 1:1-He, 1-LF
Step 8: Ramp up %P Step 1
Step 9: Ramp up %P Step 2
Step 10: Ramp up %P Step 3
Step 11: Ramp up %P Step 4
Step 12: Dep. 2:2-LF/HF,SdW2, wait(2SDT)
Step 13: End Process: HF-RF off, Idle Plasma Results of a process for depositing a PSG film according an embodiment of the present invention using the recipe of Table I are shown in FIGS. 7 through 9. FIG. 7 is an electron microscope image of a sectional side view of a PSG film deposited according to an embodiment of the present invention, showing that the film is substantially free of cave defects.

FIG. 8 is a graph comparing uniformity of the phosphorous content through a PSG film deposited according to an embodiment of the present invention to a PSG film deposited by a conventional process. FIG. 9 is another graph showing uniformity of the phosphorous content through a PSG film deposited according to an embodiment of the present invention. Preferably, the phosphorous content of a PSG film at a depth of 10% to 90% of the film thickness will vary by at most 1%, more preferably by at most 0.5%. Preferably, the phosphorous content of a PSG film at all depths from 10% to 90% of the film thickness will be 8.5% to 10.5%, more preferably 9 to 10%.

Other processing may be used to complete formation of semiconductor devices from the semiconductor structure. For example, gate stacks and source/drain regions may be formed in the substrate, additional dielectric layers may be formed on the substrate, and contacts and metallization layers may be formed on these structures. These additional elements may be formed before, during, or after formation of the PSG film.

The related processing steps, including the etching of layers, polishing, cleaning, and deposition steps, for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; Wolf, Silicon Processing for the VLSI Era, Lattice Press, 1986, 1990, 1995 (vols 1-3, respectively), and Microchip Fabrication 4rd. edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

The invention claimed is:

1. A method of forming a phosphosilicate glass, comprising:
    flowing a pre-deposition gas comprising helium and oxygen into a deposition chamber containing a substrate, wherein the temperature of the substrate is at a pre-deposition temperature of at least 400° C.;
    continuously increasing the temperature of the substrate to a deposition temperature and simultaneously continuously increasing a flow rate of phosphine and silane until a phosphine:silane deposition ratio is achieved; and
    depositing the phosphosilicate glass on the substrate at the deposition temperature and at the phosphine:silane deposition ratio;
    wherein a ratio of flow rates of helium:oxygen is 8-11:1.

2. The method of claim 1, wherein the pre-deposition temperature is at least 440° C.

3. The method of claim 1, wherein the continuous increasing of the temperature of the gas in the chamber to the deposition temperature is at a rate of 13 to 50° C./s.

4. A method of forming a phosphosilicate glass, comprising:
    flowing a pre-deposition gas comprising helium and oxygen into a deposition chamber containing a substrate, wherein the temperature of the substrate is at a pre-deposition temperature of 440-460° C.;
    continuously increasing the temperature of the substrate to a deposition temperature and simultaneously continuously increasing a flow rate of phosphine and silane until a phosphine:silane deposition ratio is achieved; and
    depositing the phosphosilicate glass on the substrate at the deposition temperature and at the phosphine:silane deposition ratio;
    wherein a ratio of flow rates of helium:oxygen is 8-11:1.

5. The method of claim 4, wherein the continuous increasing of the temperature of the substrate to the deposition temperature is at a rate of 13 to 50° C./s.

6. The method of claim 1, wherein the phosphosilicate glass at a depth of 10% to 90% of a thickness of the phosphosilicate glass has a phosphorous content which varies by at most 1%.

7. The method of claim 4, wherein the phosphosilicate glass at a depth of 10% to 90% of a thickness of the phosphosilicate glass has a phosphorous content which varies by at most 0.5%.

8. A method of making a semiconductor device, comprising:
    forming a semiconductor structure by the method of claim 4, and forming a semiconductor device from the semiconductor structure.

9. A method of making an electronic device, comprising:
    forming a semiconductor device by the method of claim 8, and forming an electronic device comprising the semiconductor device.

10. The method of claim 1, wherein a ratio of flow rates of helium:oxygen is about 9.5:1.

11. The method of of claim 1, wherein the pre-depostion gas comprises one of Ar and Ne.

12. The method of claim 1, wherein the continuous increasing of the temperature of the gas in the chamber to the deposition temperature is at a rate of 20 to 30° C./s.

13. The method of claim 1, wherein the deposition chamber is from a high density plasma tool.

14. The method of claim 4, wherein the phosphosilicate glass at a depth of 10% to 90% of a thickness of the phosphosilicate glass has a phosphorous content which varies by at most 1%.

15. The method of claim 1, wherein the phosphosilicate glass at a depth of 10% to 90% of a thickness of the phosphosilicate glass has a phosphorous content which varies by at most 0.5%.

16. The method of claim 4, wherein a ratio of flow rates of helium:oxygen is about 9.5:1.

17. The method of claim 4, wherein the pre-depostion gas comprises one of Ar and Ne.

18. The method of claim 4, wherein the continuous increasing of the temperature of the gas in the chamber to the deposition temperature is at a rate of 20 to 30° C./s.

19. The method of claim 4, wherein the deposition chamber is from a high density plasma tool.

* * * * *